Figure 1:
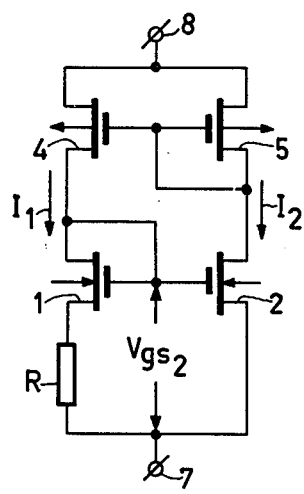

United States Patent [19]

Sempel

[11] 4,399,375
[45] Aug. 16, 1983

[54] CURRENT STABILIZER COMPRISING ENHANCEMENT FIELD-EFFECT TRANSISTORS

[75] Inventor: Adrianus Sempel, Eindhoven, Netherlands

[73] Assignee: U.S. Philips Corporation, New York, N.Y.

[21] Appl. No.: 238,295

[22] Filed: Feb. 25, 1981

[30] Foreign Application Priority Data

Mar. 17, 1980 [NL] Netherlands .......................... 8001560

[51] Int. Cl.³ ................................................ G05F 1/56
[52] U.S. Cl. ...................................... 307/297; 323/315; 330/257
[58] Field of Search ................ 307/297, 304; 323/315, 323/316; 330/257, 288; 357/43

[56] References Cited

U.S. PATENT DOCUMENTS

| | | | |
|---|---|---|---|
| 4,188,588 | 2/1980 | Dingwall | 330/257 X |
| 4,300,091 | 11/1981 | Schade, Jr. | 330/288 X |
| 4,329,705 | 5/1982 | Baker | 357/43 |

Primary Examiner—Larry N. Anagnos
Assistant Examiner—David R. Hudspeth
Attorney, Agent, or Firm—Robert T. Mayer; Bernard Franzblau

[57] ABSTRACT

A current stabilizer having two parallel current paths coupled by means of two different current coupling circuits in order to obtain a stabilizing point. At least one of the two coupling circuits comprises two enhancement field-effect transistors which are each included in one of the two current paths. One of said field-effect transistors has a gate-source voltage which has a constant voltage difference with respect to the gate-source voltage of the other transistor by including between the gate electrodes of the two field-effect transistors, a biased bipolar semiconductor junction.

8 Claims, 7 Drawing Figures

CURRENT STABILIZER COMPRISING ENHANCEMENT FIELD-EFFECT TRANSISTORS

The invention relates to a current stabilizer comprising enhancement field-effect transistors in which a first and a second parallel current path are current-coupled to each other via a first and a second current coupling circuit which define a different relationship between the currents in the first and the second current paths, and with one common point (value) unequal to zero at which the currents in the first and the second current paths stabilise themselves.

Such circuits are used on a large scale in bipolar versions (see inter alia DT-OS No. 21 57 756). The first current coupling circuit is then a current mirror which defines a linear relationship between the currents in the first and the second current paths and the second current coupling circuit is a current mirror with a resistor included in the emitter circuit of one of the transistors of the current mirror to provide degeneration in order to obtain a non-linear relationship between the currents in the two current paths.

Current stabilisers are also frequently required in integrated circuits equipped with field-effect transistors. Using transistors of the depletion type presents no problem because a field-effect transistor of the depletion type can be operated as a current source by means of a connection between the gate electrode and the source electrode. However, this is not possible when field-effect transistors of the enhancement type are used.

It is possible and known per se to "translate" said bipolar stabiliser into a version with field-effect transistors by replacing the transistors by field-effect transistors. However, the use of said resistor is then less attractive because the current at which the circuit stabilises itself has a square-law relationship with the value of said resistor so that the stabiliser is very sensitive to variations in the spread of the resistance value and such a resistor generally occupies much space in the integrated circuit. These problems may be avoided by replacing said resistor by a field-effect transistor (of the enhancement type) operated as a resistor, but this merely shifts the problem because the gate electrode of this field-effect transistor should then be biased by means of a stable voltage source, which again demands a voltage stabiliser which may also be subject to spread.

It is an object of the invention to provide a circuit of the type mentioned in the preamble which is subject to minimal spread and which can simply be realised without the use of a resistor as a stabilising element. To this end the invention is characterized in that the first current coupling circuit comprises field-effect transistors of a first conductivity type and that the second current coupling circuit comprises a first field-effect transistor of a second conductivity type opposite to that of the first one, whose channel is included in the first current path, and a second field effect transistor of the second conductivity type, whose channel is included in the second current path, of which first and second field effect transistors the source electrodes are connected to a first common terminal, the current stabiliser comprising means for defining a substantially constant difference between the gate-source voltage of the first field-effect transistor and the gate-source voltage of the second field-effect transistor.

The stabiliser in accordance with the invention does not present the said problems because the use of a resistor as a stabilising element is avoided.

The principle of the circuit in accordance with the invention is that the difference between the gate-source voltage of the one transistor and the gate-source voltage of the other transistor is substantially constant so that the voltage-current characteristics, if related to the source-gate voltage of the first or the second transistor, will have a different zero point and that owing to the different dimensioning of the first and the second transistor and/or of the transistor of the first current coupling circuit a stabilising point is obtained.

The invention may further be characterized in that said means comprise a bipolar semiconductor junction.

A preferred embodiment of such a current stabiliser is further characterized in that the bipolar semiconductor junction is the base-emitter junction of a bipolar transistor, whose base electrode is connected to the gate electrode of the second field-effect transistor and whose emitter electrode is connected to the gate electrode of the first field-effect transistor and to a bias-current source, the gate electrode of the second transistor being coupled to the drain electrode of the first transistor in a regenerative sense.

In this respect it is advantageous that the bias-current source be a third field-effect transistor of the second conductivity type, which is arranged as a current mirror together with a transistor of the current stabiliser.

Furthermore, this embodiment is characterized in that the gate electrode of the third field-effect transistor is connected to the gate electrode of the second field-effect transistor, the source electrode to the source electrode of said second field-effect transistor and the drain electrode to the emitter electrode of the bipolar transistor.

Such a current stabiliser, in which the first current coupling circuit is a current mirror arrangement, may further be characterized in that the input circuit of said current mirror arrangement is included in the drain circuit of the first transistor and the output circuit in the drain circuit of the second transistor, that the gate electrode of a fourth transistor of the first conductivity type is connected to a point between the output circuit of the current mirror and the drain circuit of the second transistor. The drain circuit of the fourth transistor is connected via the channel of a fifth transistor of the second conductivity type to a power-supply terminal, which fifth transistor, together with the third transistor and a sixth transistor, is arranged as a current mirror and constitutes the input circuit of this current mirror, the drain electrode of the sixth transistor being connected to the first common terminal and the drain electrode of the third transistor to the emitter of the bipolar transistor.

In this respect it is advantageous that the collector electrode of the bipolar transistor be connected directly to a power supply terminal.

In this way the bipolar transistor can simply be realised in an integrated circuit with field-effect transistors. For this purpose the current stabiliser is further characterized in that the field-effect transistors are formed in a semiconductor layer of a first type which is deposited on a substrate of the second type, by forming source and drain diffusions of the second type in said layer of said first type and that the bipolar transistor is constituted by a diffusion to be formed in an insulated portion of said layer of the first type, said diffusion of the second type constituting the emitter of said bipolar transistor, the said insulated portion of the layer of the first type constituting the base, and the substrate constituting the collector.

Figure 2:
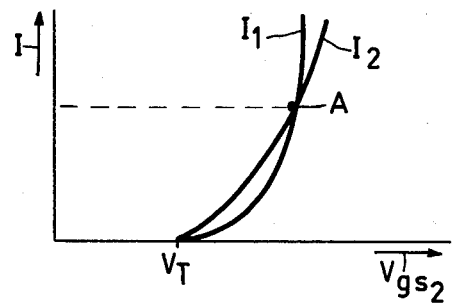
Figure 3:
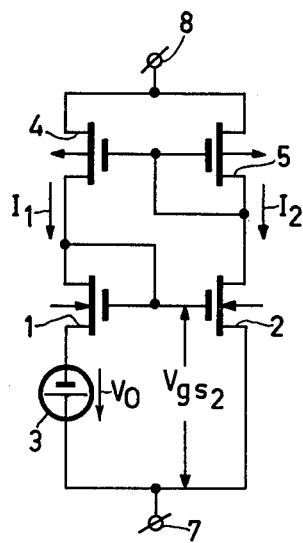
Figure 4:
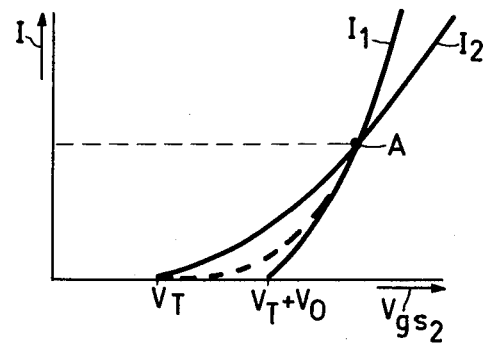
Figure 5:
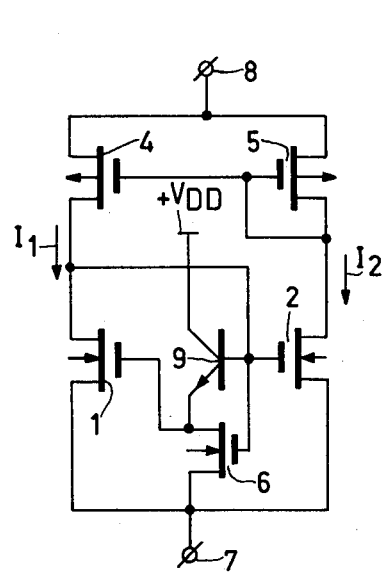
Figure 6:
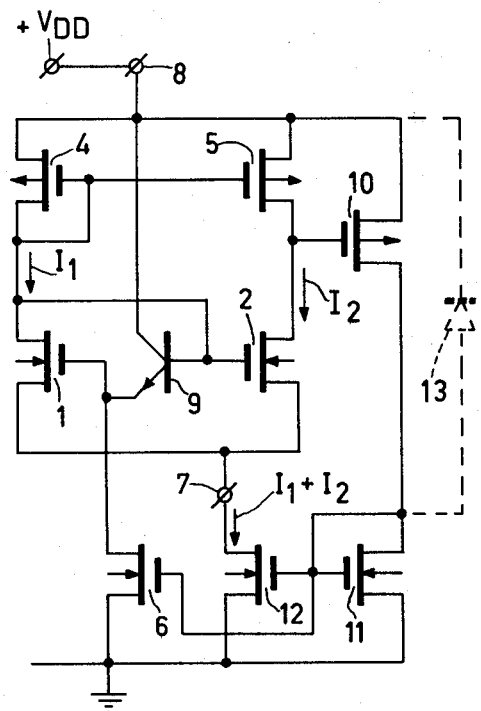
Figure 7:
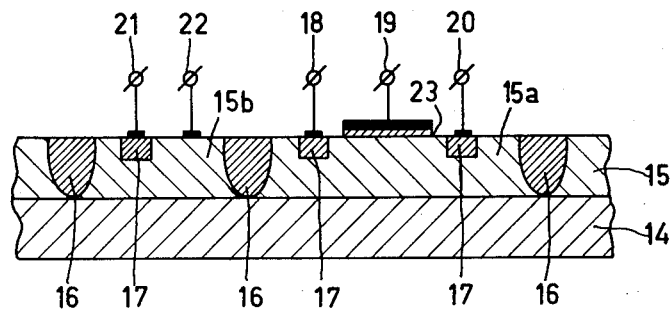

The invention will now be described in more detail with reference to the drawing, in which:

FIG. 1 represents a known current stabiliser with a field-effect transistor,

FIG. 2 shows a diagram illustrating the operation of the circuit arrangement of FIG. 1, FIG. 3 is a circuit diagram of a current stabiliser in accordance with the invention, FIG. 4 is a diagram illustrating the operation of the circuit arrangement of FIG. 3, FIG. 5 represents a first embodiment of a circuit arrangement in accordance with the invention, FIG. 6 represents a second embodiment of a circuit arrangement in accordance with the invention, and FIG. 7 is a cross-sectional view of a part of an integrated circuit with field-effect transistors, illustrating how a bipolar transistor is realised in such an integrated circuit.

FIG. 1 shows a version of a current stabiliser with field-effect transistors which is frequently used in bipolar form. It comprises a current mirror with p-channel transistors 4 and 5, which current mirror is coupled to a current mirror comprising n-channel transistors 1 and 2, which is rendered non-linear by the inclusion of a resistor R in the source circuit of transistor 1.

FIG. 2 represents the currents $I_1$ and $I_2$, which flow in the current paths constituted by the series connection of the channels of transistors 1 and 4 and the series connection of the channels of transistors 2 and 5 respectively, as a function of the gate-source voltage $V_{gs2}$ of transistor 2. Transistors 1 and 2 are both turned on when $V_{gs2}=V_T$, which is the threshold voltage of the n-channel transistors 1 and 2 being used. The current $I_1$ as a function of Vgs initially varies more gradually owing to the presence of the resistor R. By selecting the $\beta$, which is a constant which is proportional to the ratio of width and length of the channel of a field-effect transistor, of transistor 1 to be greater than the $\beta$ of transistor 2, the two curves will intersect in point A, where $I_1=I_2$. If the current mirror comprising transistors 4 and 5 defines said relationship $I_1=I_2$ between these currents, the circuit will stabilise in point A. If the factor $\beta$ of transistor 1 is equal to that of transistor 2, the curves will not intersect. However, a stabilisation point can still be obtained if the $\beta$ of transistor 5 is made n times as great as that of transistor 4, so that the operating point becomes $I_2=nI_1$. A combination of the two inequalities in $\beta$ is also possible.

A drawback of the circuit arrangement of FIG. 1 is the use of the resistor R.

FIG. 3 shows an embodiment of the circuit of FIG. 1 in which the resistor R is replaced by a source 3 of constant voltage $V_O$.

FIG. 4 represents the currents $I_1$ and $I_2$ as a function of the gate-source voltage $V_{gs2}$ of transistor 2. The current $I_2$ will flow for $V_{gs2}>V_T$ and the current $I_1$ for $V_{gs2}>V_T+V_O$. $I_2$ as a function of $V_{gs2}$ is selected to vary more gradually by selecting said factor $\beta$ of transistor 1 to be greater than that of transistor 2. The curves $I_1$ and $I_2$ then intersect in point A, which is the stabilising point if the current mirror comprising transistors 4 and 5 imposes a unity ratio on the currents $I_1$ and $I_2$. In the circuit of FIG. 3, in a similar way to the circuit of FIG. 1, it is possible to select the $\beta$'s of the transistors 1 and 2 to be equal, so that the functions $I_1$ and $I_2$ in the diagram of FIG. 4 do not intersect. Stabilisation is then possible if transistor 5 has a $\beta$ which is n times as great as that of transistor 4, so that the circuit stabilises at $I_1=nI_2$. Again it is possible to employ a combination of the two possibilities.

The voltage source 3 may simply be constituted by a diode. The voltage $V_O$ then corresponds to the diode voltage $V_d$ at the stabilised value of the current $I_1$, which voltage $V_d$ is then substantially constant near the stabilisation point A (see FIG. 4). For very small currents the voltage $V_d$ decreases, which in the diagram shown in this Figure means a correction of the curve for the current $I_1$ in accordance with the dashed line. In practice such a voltage source in conjunction with field-effect transistors may be regarded as a constant-voltage source because, even at comparatively small currents, the voltage across the diode is hardly current dependent in comparison with the dependence of the current ($I_1$) on the source-gate voltage of a field-effect transistor (1).

Instead of a constant-voltage source in the source circuit of transistor 1, the voltage source may also be included between the gate electrodes of the transistors 1 and 2. If, for this purpose the base-emitter junction of a transistor is employed, this enables said junction to be biased with a current source so that the said slight current dependence does not exist. Since in practice said dependence presents no problems and since the stabilizer itself supplies a constant current, this may be utilised by deriving the bias for the bipolar transistor from the stabiliser itself. By deriving said current from transistor 2, i.e. having it follow the current $I_2$, the dashed correction in FIG. 4 becomes even smaller because, directly after starting of the current stabilising arrangement, the voltage across the base-emitter junction of said transistor increases rapidly to a fairly constant value.

FIG. 5 shows a first embodiment of a current stabiliser thus designed. In comparison with the circuit of FIG. 3, the voltage source 3, connected in the source circuit of transistor 1 in FIG. 3, is replaced by a bipolar transistor 9, whose base electrode is connected to the gate electrode of the transistor 2, whose emitter electrode is connected to the gate electrode of transistor 1, and whose collector electrode is connected to a positive power supply terminal $+V_{DD}$. As an emitter-current source for the bipolar transistor 8, an n-channel field-effect transistor 6 is employed whose source and gate electrodes are respectively connected to the source and gate electrodes of transistor 2 so that, together with transistor 2, it functions as a current mirror for the current $I_2$. The drain electrode of transistor 1 is connected to the gate electrode of transistor 2 instead of to the gate electrode of transistor 1—which in principal is also possible—in order that the bipolar transistor 9 can derive base current from the drain current of transistor 1. If the gate electrode of transistor 1 were coupled to the drain electrode of the same transistor, this should be effected via for example a source-follower in order to ensure that the emitter current of transistor 9 is not mixed with the drain current $I_1$ of transistor 1 and steps should be taken to provide transistor 9 with base current. Further, the operation is identical to that of the circuit of FIG. 3, where $V_O$ is the base-emitter voltage of the bipolar transistor 9. An advantage of the connection of the collector of transistor 9 to the positive supply voltage is that in an integrated circuit in which the channels of the n-channel field-effect transistors are formed in a p-type layer on an n-channel substrate, which is connected to the positive supply voltage $V_{DD}$, the bipolar transistor 9 can be obtained very simply by forming an n-type source diffusion in the p-layer, so that said p-layer functions as the base, said n-type diffusion as the emitter and the substrate as the collector, which is thus automatically connected to the positive supply voltage. Thus, it is very simple to realise a vertical npn transistor in an integrated circuit with field-effect transistors.

FIG. 6 shows a modification of the circuit of FIG. 5 in which the emitter-current source transistor 6 is not connected to the common terminal 7 with its source electrode, but to a ground terminal, the gate electrode being connected to the gate electrode of transistor 11. In the present example point 8 is connected to the positive supply voltage $+V_{DD}$. The common gate electrodes of transistors 4 and 5 are not connected to the drain electrode of the transistor 5, but to that of transistor 4. Instead of driving transistors 4 and 5 with the drain current of transistor 2, the drain electrode of transistor 5 is connected to the gate electrode of a p-channel transistor 10, whose source electrode is connected to the positive supply voltage $V_{DD}$ and whose drain electrode is connected to the drain electrode and the gate electrode of transistor 11, which together with transistor 6 supplies the emitter current for transistor 9, and a transistor 12 is arranged as a current mirror. The drain electrode of transistor 12 is connected to terminal 7.

The circuit operates as follows: if transistor 2 draws current, transistor 10 is turned on so that via transistor 11 and transistor 12 current is applied to terminal 7, as a result of which transistor 5 is driven via transistor 1 and transistor 4, so that ultimately transistor 2 and 5 carry the current $I_2$ (the gate electrode of transistor 10 draws no current$b$) and transistors 1 and 4 draw the current $I_1$, the circuit stabilising itself at point A in the characteristic in accordance with FIG. 4, where $V_O$ is the base-emitter voltage of transistor 9.

In order to start the circuit—for $I_1=I_2=0$ is also stable situation—a reverse-biased diode 13 may be included between the gate electrode of transistor 11 and the positive supply terminal $+V_{DD}$, the leakage current of said diode being sufficiently high to assure that the circuit is started, so that it operates at the desired stable point.

In the embodiment of FIG. 6 the stabilised current $I_1$ or $I_2$ cannot be taken from terminals 7 and 8. These stabilised currents, however, can always be coupled out via a current mirror techniques—also in the circuits of FIGS. 3 and 5—for example by connecting a field-effect transistor with its source-gate electrode in parallel with the source-gate electrode of transistor 1, 2, 4 or 11.

FIG. 7 shows a part of a cross-sectional view of an integrated circuit to illustrate how the bipolar transistor 9 is realised in an integrated circuit with field-effect transistors having an n-type substrate 14. On said substrate a p-type epitaxial layer 15 is deposited, which is divided into individual regions (15a, 15b) by regions 16. In another type of process, instead of by means of the use of an epitaxial layer 15, the p-type regions 15a and 15b may also be realised by forming deep p-type diffusions ("pocket") in the substrate 14. By means of an n-type diffusion 16 with a terminal 18 a source-electrode terminal of an n-channel field-effect transistor is obtained in the region 15a. A drain electrode is obtained by forming an n-type diffusion 17 with a terminal 20, and a gate electrode by forming an electrode 19 on an insulating intermediate layer 23 between the drain and source electrodes. A vertical npn-transistor is formed by the substrate 14, the p-type region 15b, which is provided with a terminal 22, and an n-type diffusion 17, which is provided with a terminal 21, which in this order constitute the collector, base and emitter of an npn-transistor.

What is claimed is:

1. A current stabiliser comprising first and second parallel current paths current-coupled to each other via first and second current coupling circuits which define a different relationship between the currents in the first and the second current paths and with a common value unequal to zero at which the currents in the first and second path stabilize themselves, the first current coupling circuit comprising enhancement type field-effect transistors of a first channel conductivity type and the second current coupling circuit comprising a first enhancement field-effect transistor of a second channel conductivity type opposite to the first one and having a channel included in the first current path and a second enhancement field-effect transistor of said second conductivity type and having a channel included in the second current path, of which first and second field-effect transistors the source electrodes are coupled to a first common terminal, and means for defining a substantially constant difference between the gate-source voltage of the first field-effect transistor and the gate-source voltage of the second field-effect transistor.

2. A current stabiliser as claimed in claim 1, characterized in that said voltage defining means comprise a bipolar semiconductor junction.

3. A current stabiliser as claimed in claim 2, characterized in that said bipolar semiconductor junction comprises the base-emitter junction of a bipolar transistor having a base electrode connected to the gate electrode of the second field-effect transistor and whose emitter electrode is connected to the gate electrode of the first field-effect transistor and to a bias-current source, the gate electrode of the second transistor being coupled to the drain electrode of the first transistor.

4. A current stabiliser as claimed in claim 3, wherein the bias-current source comprises a third field-effect transistor of the second conductivity type arranged as a current mirror together with a transistor of the current stabiliser.

5. A current stabiliser as claimed in claim 4, characterized in that the gate electrode of the third field-effect transistor is connected to the gate electrode of the second field-effect transistor, the source electrode to the source electrode of said second field-effect transistor and the drain electrode to the emitter electrode of the bipolar transistor.

6. A current stabiliser as claimed in claim 4, wherein the first current coupling circuit comprises a current mirror arrangement, characterized in that the input circuit of said current mirror arrangement is included in the drain circuit of the first transistor and the output circuit in the drain circuit of the second transistor, that a gate electrode of a fourth transistor of the first conductivity type is connected to a point between the output circuit of the current mirror and the drain circuit of the second transistor, of which fourth transistor the drain circuit is connected to a power supply terminal via the channel of a fifth transistor of the second conductivity type, that said fifth transistor, together with the third transistor and a sixth transistor, is arranged as a current mirror and constitutes the input circuit of the current mirror, the drain electrode of the sixth transistor being connected to the first common terminal and the drain electrode of the third transistor being connected to the emitter of the bipolar transistor.

7. A current stabiliser as claimed in claims 3, 4, 5 or 6, characterized in that the collector electrode of the bipolar transistor is connected directly to a power supply terminal.

8. A current stabiliser as claimed in claim 7, characterized in that the field-effect transistors are formed in a semiconductor layer of a first conductivity type which is deposited on a substrate of the second conductivity type, by forming source and drain diffusions of the second type in said layer of said first type, and that the bipolar transistor is constituted by a diffusion of the second type formed in an insulated portion of said layer of the first type, said diffusion of the second type constituting the emitter of said bipolar transistor, said insulated portion of the layer of the first type constituting the base, and the substrate constituting the collector.

* * * * *